United States Patent
Huang et al.

(10) Patent No.: US 11,562,969 B2
(45) Date of Patent: Jan. 24, 2023

(54) SEMICONDUCTOR DEVICE PACKAGE INCLUDING REINFORCED STRUCTURE

(71) Applicant: Advanced Semiconductor Engineering, Inc., Kaohsiung (TW)

(72) Inventors: Yu-Che Huang, Kaohsiung (TW); Lu-Ming Lai, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/569,228

(22) Filed: Sep. 12, 2019

(65) Prior Publication Data
US 2021/0082835 A1    Mar. 18, 2021

(51) Int. Cl.
 H01L 23/49    (2006.01)
 H01L 23/00    (2006.01)
 H01L 23/31    (2006.01)
 H01L 23/495   (2006.01)
 H01L 21/56    (2006.01)
 H01L 21/48    (2006.01)

(52) U.S. Cl.
 CPC ........ H01L 23/562 (2013.01); H01L 21/4825 (2013.01); H01L 21/565 (2013.01); H01L 23/3114 (2013.01); H01L 23/4952 (2013.01); H01L 23/49513 (2013.01); H01L 23/49541 (2013.01)

(58) Field of Classification Search
 CPC ............ H01L 23/562; H01L 23/4952; H01L 21/4825; H01L 21/565; H01L 23/3114; H01L 23/49513; H01L 23/49541
 USPC ........................................ 257/669; 438/123
 See application file for complete search history.

(56) References Cited

U.S. PATENT DOCUMENTS

| 6,503,780 B1* | 1/2003 | Glenn ............... H01L 27/14618 438/106 |
| 9,890,034 B2 | 2/2018 | Bai et al. |
| 10,043,924 B1* | 8/2018 | Kaufmann ........ H01L 31/02327 |
| 2001/0028072 A1* | 10/2001 | Aoki ..................... G01L 19/141 257/254 |
| 2004/0080037 A1* | 4/2004 | Foong ............... H01L 27/14618 257/687 |
| 2005/0140005 A1* | 6/2005 | Huang ................ H01L 23/3128 257/737 |
| 2006/0163714 A1* | 7/2006 | Tsao .................. H01L 27/14683 257/687 |
| 2010/0193240 A1* | 8/2010 | Takayama ........... H01L 23/3121 174/521 |
| 2011/0109000 A1* | 5/2011 | Kim ...................... H01L 23/562 257/787 |
| 2012/0231584 A1* | 9/2012 | Kawahara ............. H01L 21/568 438/122 |

(Continued)

Primary Examiner — Didarul A Mazumder
(74) Attorney, Agent, or Firm — Foley & Lardner LLP

(57) ABSTRACT

A semiconductor device package and a method for packaging the same are provided. A semiconductor device package includes a carrier, an electronic component, a buffer layer, a reinforced structure, and an encapsulant. The electronic component is disposed over the carrier and has an active area. The buffer layer is disposed on the active area of the electronic component. The reinforced structure is disposed on the buffer layer. The encapsulant encapsulates the carrier, the electronic component and the reinforced structure.

19 Claims, 13 Drawing Sheets

(56) References Cited

U.S. PATENT DOCUMENTS

| | | | |
|---|---|---|---|
| 2013/0126988 A1* | 5/2013 | Lo | H01L 24/97 |
| | | | 438/51 |
| 2015/0049498 A1* | 2/2015 | Zhou | F21V 21/00 |
| | | | 362/382 |
| 2017/0247250 A1* | 8/2017 | Otte | G01L 9/0054 |
| 2018/0212114 A1* | 7/2018 | Wu | H01L 33/56 |
| 2019/0139848 A1* | 5/2019 | Abderrazzaq | H01L 23/5389 |
| 2019/0164907 A1* | 5/2019 | Chen | H01L 27/0203 |
| 2019/0288686 A1* | 9/2019 | Zhao | H01L 25/167 |
| 2019/0295914 A1* | 9/2019 | Chang | H01L 23/295 |
| 2019/0319057 A1* | 10/2019 | Wang | H04N 5/369 |
| 2020/0027804 A1* | 1/2020 | Fang | H01L 23/49811 |
| 2020/0161205 A1* | 5/2020 | Nguyen | H01L 21/561 |

* cited by examiner

US 11,562,969 B2

SEMICONDUCTOR DEVICE PACKAGE INCLUDING REINFORCED STRUCTURE

TECHNICAL FIELD

The present disclosure generally relates to a semiconductor device package and a method for packaging the same.

BACKGROUND

A semiconductor device package can have a semiconductor device (e.g. a die or a chip) which is attached to a carrier and encapsulated by an encapsulant. However, the stress resulted from thermal cycling (e.g. coefficient of thermal expansion (CTE) mismatch) during manufacture may remain in the semiconductor device package. The residual stress may adversely affect performance or reliability of the semiconductor device package.

SUMMARY

A semiconductor device package is provided in accordance with some embodiments of the present disclosure. The semiconductor device package includes a carrier, an electronic component, a buffer layer, a reinforced structure, and an encapsulant. The electronic component is disposed over the carrier and has an active area. The buffer layer is disposed on the active area of the electronic component. The reinforced structure is disposed on the buffer layer. The encapsulant encapsulates the carrier, the electronic component and the reinforced structure.

A method for packaging a semiconductor device is provided in accordance with some embodiments of the present disclosure. The method includes providing a carrier. The method also includes disposing an electronic component on the carrier. The method further includes disposing a buffer layer on the electronic component. The method further includes disposing a reinforced structure on the buffer layer.

BRIEF DESCRIPTION OF THE DRAWINGS

Aspects of the present disclosure are readily understood from the following detailed description when read with the accompanying figures. It is noted that various features may not be drawn to scale, and the dimensions of the various features may be arbitrarily increased or reduced for clarity of discussion.

DETAILED DESCRIPTION

Figure 1:
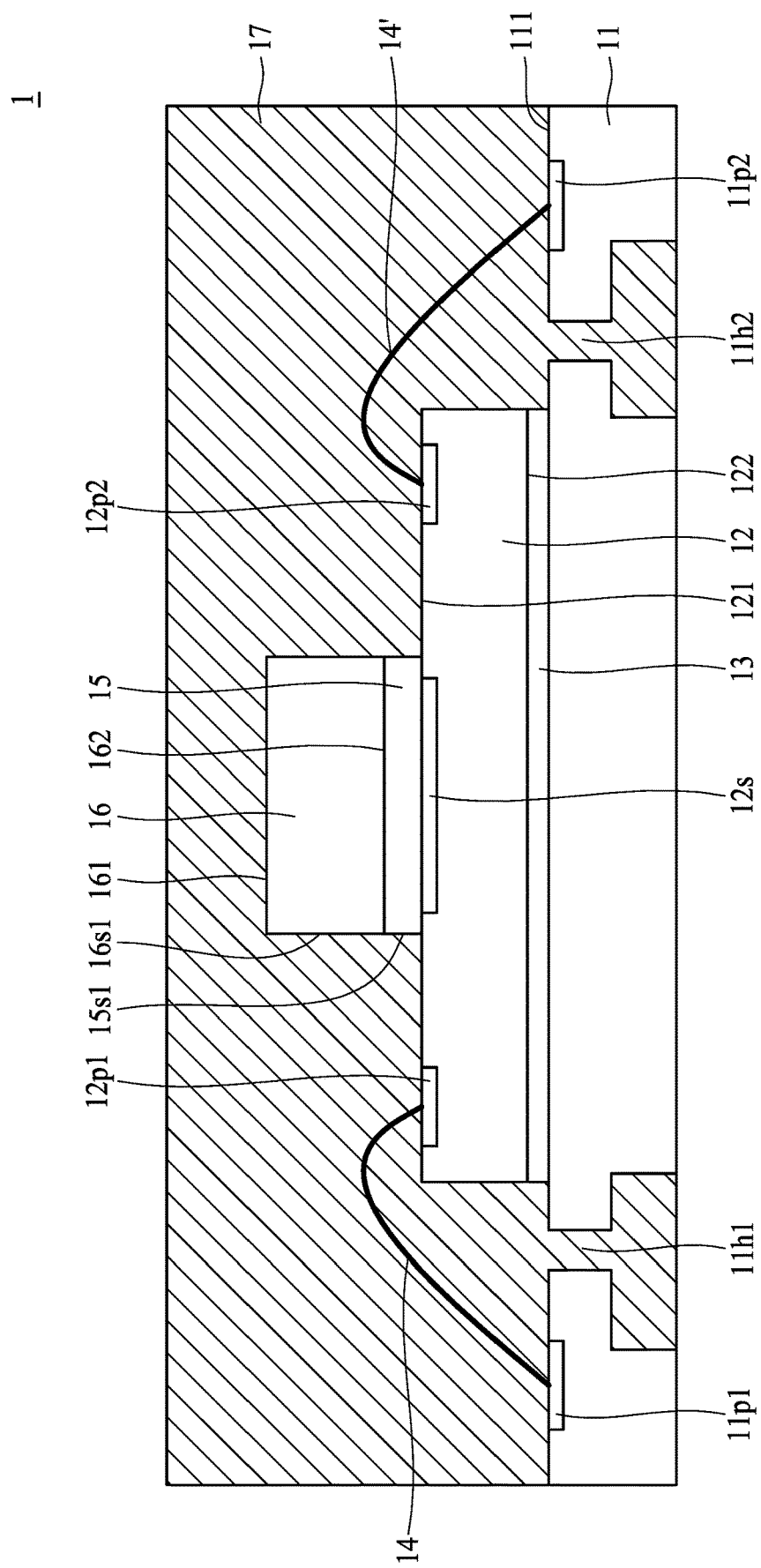
FIG. 1 is a schematic diagram illustrating a cross-sectional view of a semiconductor device package according to some embodiments of the present disclosure.

Embodiments of the present disclosure and use thereof are discussed in detail below. It should be appreciated, however, that the embodiments set forth many applicable concepts that can be embodied in a wide variety of specific contexts. It is to be understood that the following disclosure provides for many different embodiments or examples of implementing different features of various embodiments. Specific examples of components and arrangements are described below for purposes of discussion. These are, of course, merely examples and are not intended to be limiting.

Spatial descriptions, including such terms as "above," "below," "up," "left," "right," "down," "top," "bottom," "vertical," "horizontal," "side," "higher," "lower," "upper," "over," "under," and so forth, are used herein with respect to an orientation shown in corresponding figures unless otherwise specified. It should be understood that the spatial descriptions used herein are for purposes of illustration, and that practical implementations of the structures described herein can be spatially arranged in any orientation or manner, provided that the merits of embodiments of this disclosure are not deviated from by such arrangement.

Embodiments, or examples, illustrated in the figures are disclosed below using specific language. It will nevertheless be understood that the embodiments and examples are not intended to be limiting. Any alterations and modifications of the disclosed embodiments, and any further applications of the principles disclosed in this document, as would normally occur to one of ordinary skill in the pertinent art, fall within the scope of this disclosure.

In addition, the present disclosure may repeat reference numerals and/or letters in the various examples. This repetition is for the purpose of simplicity and clarity and does not in itself dictate a relationship between the various embodiments and/or configurations discussed herein.

The present disclosure provides for a semiconductor device package and a method for packaging the same. Embodiments of semiconductor device packages and methods described herein provide some semiconductor device packages to mitigate or relieve residual stress by, for example, introducing low modules die attach film (DAF) or film over wire (FOW), and/or reinforced structure(s) (e.g., dummy chip).

FIG. 1 is a schematic diagram illustrating a cross-sectional view of a semiconductor device package according to some embodiments of the present disclosure. Referring to FIG. 1, the semiconductor device package 1 includes a carrier 11, an electronic component or semiconductor device 12, an adhesive layer 13, conductive wires 14 and 14', a buffer layer 15, a reinforced structure 16 and an encapsulant 17.

The carrier 11 has conductive contacts 11p1 and 11p2 and openings 11h1 and 11h2 on the surface 111. In some embodiments, the carrier 11 may be a leadframe or a substrate including one or more traces and/or one or more conductive layers.

The electronic component 12 has a surface 121 and a surface 122 and is disposed over the carrier 11. In some embodiments, the electronic component 12 is attached to the carrier 11 by the adhesive layer 13. The electronic component 12 includes an active area 12s and conductive contacts 12p1 and 12p2. In some embodiments, the active area 12s is a sensing area used for sensing current or magnetic field/magnetic force. In some embodiments, the electronic component 12 is, for example, a current sensor chip, a Hall current sensor, a magnetic sensor chip or a piezoelectric sensor chip.

The adhesive layer 13 is disposed between the carrier 11 and the electronic component 12. The adhesive layer 13 is directly connected to the surface 122 of the electronic component 12 and the surface 111 of the carrier 11. In some embodiments, the adhesive layer 13 may include glue or a tape. The adhesive layer 13 can include isolation material(s). The adhesive layer 13 can include thermal isolation material(s). Please note that just a small voltage is applied to the electronic component 12 (e.g., sensor chip), the sensor chip itself is not a heat source, and thus the adhesive layer 13 uses thermal isolation material(s) to avoid heat affecting the sensor chip. Please also note that the major factor of heat transfer will be the carrier 11 (e.g., lead frame) as metal material (e.g., the thermal conductivity is around 15~300 W/mK according to some material properties), so the heat transfer of thermal isolation material(s) will not be considered here. The adhesive layer 13 can include electrical isolation material(s). The adhesive layer 33 can include both thermal and electrical isolation material(s). The adhesive layer 13 may include, for example but is not limited to, glass, fused silica, silicon oxide/nitride(silicon chip with oxide/nitride deposition process), ceramics, polymer such as polyimide(PI), porous material such as anodic aluminum oxide (AAO) or other suitable material(s). Although it is not illustrated in FIG. 1, however, it is contemplated that a thermal isolation plate can be disposed between the adhesive layer 13 and the electronic component 12. Although it is not illustrated in FIG. 1, however, it is contemplated that an electrical isolation plate can be disposed between the adhesive layer 13 and the electronic component 12.

The conductive wire 14 connects the electronic component 12 to the carrier 11. One end of the conductive wire 14 is electrically connected to the conductive contact 11p1 of the carrier 11. Another end of the conductive wire 14 is electrically connected to the conductive contact 12p1 of the electronic component 12. Similarly, one end of the conductive wire 14' is electrically connected to the conductive contact 11p2 of the carrier 11. Another end of the conductive wire 14' is electrically connected to the conductive contact 12p2 of the electronic component 12.

A buffer layer 15 is disposed on the active area 12s of the electronic component 12. The active area 12s is covered by the buffer layer 15. The buffer layer 15 has an area different from the electronic component 12. The buffer layer 15 has an area less than the electronic component 12. The buffer layer 15 has an area different from the active area 12s. The buffer layer 15 has an area greater than the active area 12s.

In some embodiments, the buffer layer 15 is a die attach film (DAF) with low modules/elastic modulus. The buffer layer 15 is a DAF with low Young's modulus. In some embodiments, the Young's modulus of the buffer layer is equal to or less than 10 GPa. In some embodiments, the Young's modulus of the buffer layer is in the range of 5~10 GPa. In some embodiments, the Young's modulus of the buffer layer is in the range of 0~5 GPa. In some embodiments, the Young's modulus of the buffer layer is in the range of 0.03~0.05 GPa. In some embodiments, the CTE of the buffer layer is in the range of 300~500 W/m-K.

The reinforced structure 16 is disposed on the buffer layer 15. The surface 162 of the reinforced structure 16 is directly connected to the buffer layer 15. The lateral surface 15s1 of the buffer layer 15 is substantially coplanar with the lateral surface 16s1 of the reinforced structure 16. In some other embodiments, the lateral surface of the buffer layer may not be coplanar with the lateral surface of the reinforced structure.

The reinforced structure 16 may include materials that provide stiffness and does not cause phase changes (e.g., the reinforced structure 16 will not be softened) under the reflow temperature (e.g. 260° C.) during the packaging process. In some embodiments, the reinforced structure 16 may include materials with high modules/elastic modulus. The reinforced structure 16 may include materials with high Young's modulus. In some embodiments, the reinforced structure 16 may include materials such as silicon, titanium, glass, metal, alloy, steel etc. In some embodiments, the reinforced structure 16 includes a single crystal material. In some embodiments, the reinforced structure 16 includes a dummy die or a dummy chip.

In some embodiments, the Young's modulus of the reinforced structure 16 is in the range of 130~200 GPa. In some embodiments, the CTE of the reinforced structure 16 is in the range of 1.0~5.0 W/m-K. In some embodiments, the CTE of the reinforced structure 16 is in the range of 2.6~3.0 W/m-K.

In some embodiments, the area of the buffer layer 15 is the same as the reinforced structure 16. In some embodiments, the area of the buffer layer 15 is different from the reinforced structure 16. The area of the buffer layer 15 can be smaller than that of the reinforced structure 16. The area of the buffer layer can be is greater than that of the reinforced structure 16.

The encapsulant 17 encapsulates the carrier 11, the electronic component 12, the adhesive layer 13, the conductive wires 14 and 14', the buffer layer 15 and the reinforced structure 16. The encapsulant 17 may include an epoxy resin, a molding compound (e.g., an epoxy molding compound (EMC) or other molding compound), or other suitable materials. Below is a table showing the EMC with different filler content and its corresponding CTE and Modulus.

TABLE 1

| EMC Material | Filler content (%) | CTE (W/m-K) | Modulus@RT(GPa) |
|---|---|---|---|
| EMC | 85 | 10~12 | 20~22 |
|  | 80 | 15~18 | 14~16 |
|  | 70 | 20~25 | 10~12 |

FIG. 1A, FIG. 1B, FIG. 1C, FIG. 1D, FIG. 1E and FIG. 1F illustrate a method for packaging a semiconductor device according to some embodiments of the present disclosure.

Figure 1A:
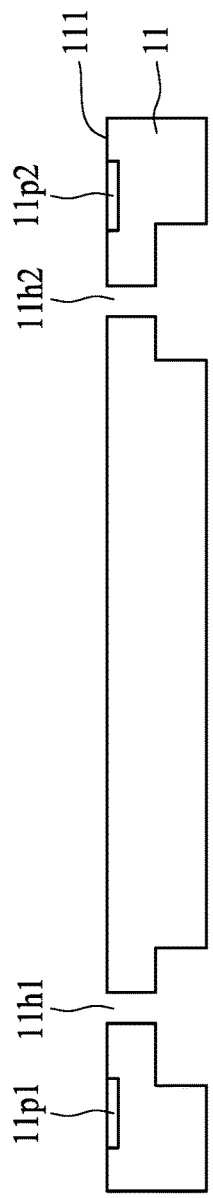
FIG. 1A, FIG. 1B, FIG. 1C, FIG. 1D, FIG. 1E and FIG. 1F illustrate a method for packaging a semiconductor device according to some embodiments of the present disclosure.

Referring to FIG. 1A, a carrier 11 is provided. The carrier 11 includes conductive contacts 11p1 and 11p2 and openings 11h1 and 11h2 on the surface 111. The plurality of openings 11h1 and 11h2 are formed on the carrier 11 by, for example, lithographic process (e.g. exposure, etching and the like).

Figure 1B:
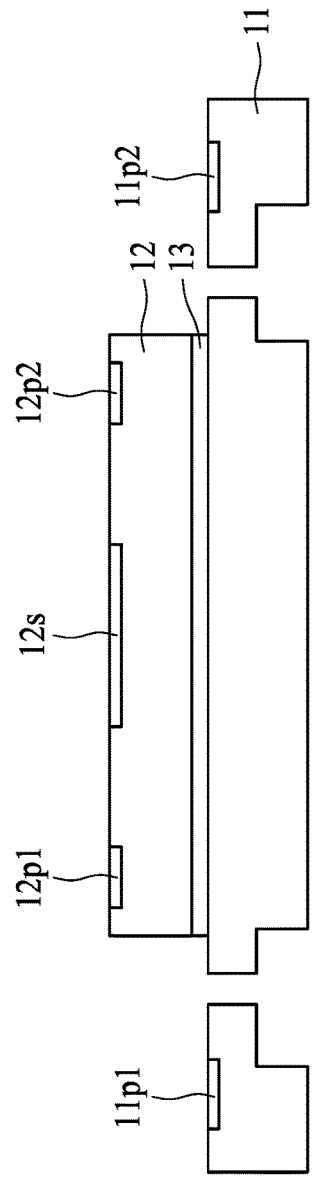

Referring to FIG. 1B, an electronic component 12 with an adhesive layer 13 is disposed on the carrier 11. The electronic component 12 is attached to the carrier 11 by the adhesive layer 13. The electronic component 12 includes an active area 12s and conductive contacts 12p1 and 12p2. In some embodiments, the active area 12s is a sensing area used for sensing current or magnetic field/magnetic force. In some embodiments, the electronic component 12 is, for example, a current sensor chip, a Hall current sensor, a magnetic sensor chip or a piezoelectric sensor chip.

Figure 1C:
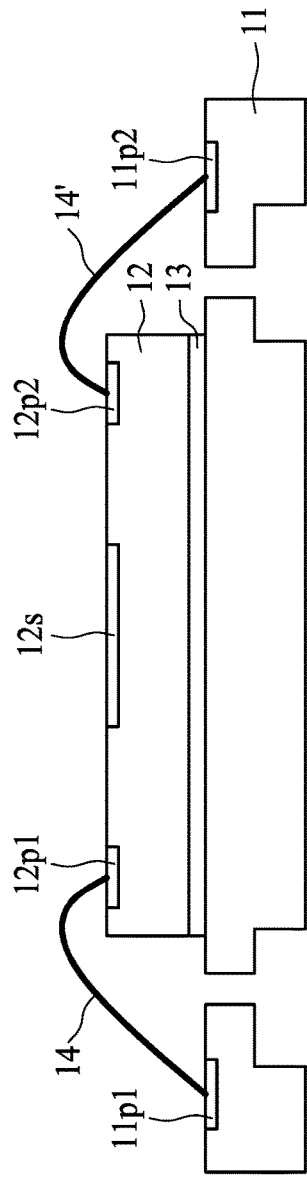

Referring to FIG. 1C, the electronic component 12 is connected to the carrier 11 via wire bonding. One end of the conductive wire 14 is electrically connected to the conductive contact 11$p$1 of the carrier 11. Another end of the conductive wire 14 is electrically connected to the conductive contact 12$p$1 of the electronic component 12. Similarly, one end of the conductive wire 14' is electrically connected to the conductive contact 11$p$2 of the carrier 11. Another end of the conductive wire 14' is electrically connected to the conductive contact 12$p$2 of the electronic component 12.

Figure 1D:
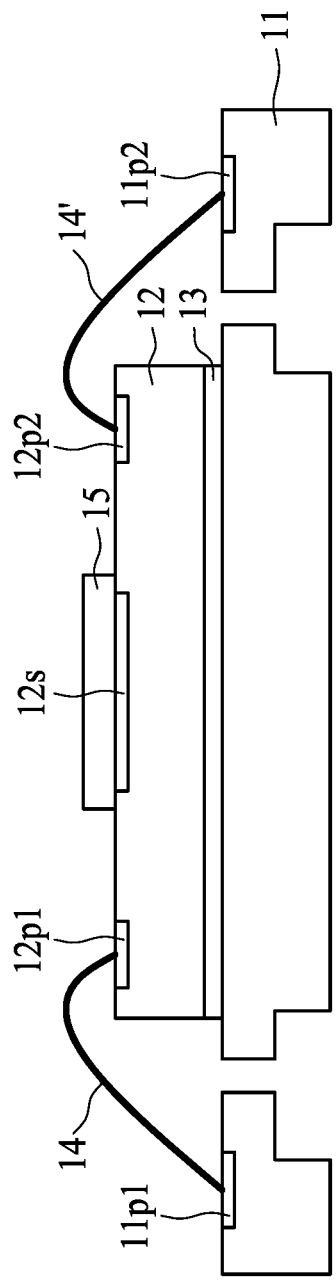

Referring to FIG. 1D, a buffer layer 15 is disposed on the electronic component 12. The buffer layer 15 covers the active area 12$s$ of the electronic component 12. Both ends of the conductive wires 14 and 14' are exposed from the buffer layer.

Figure 1E:
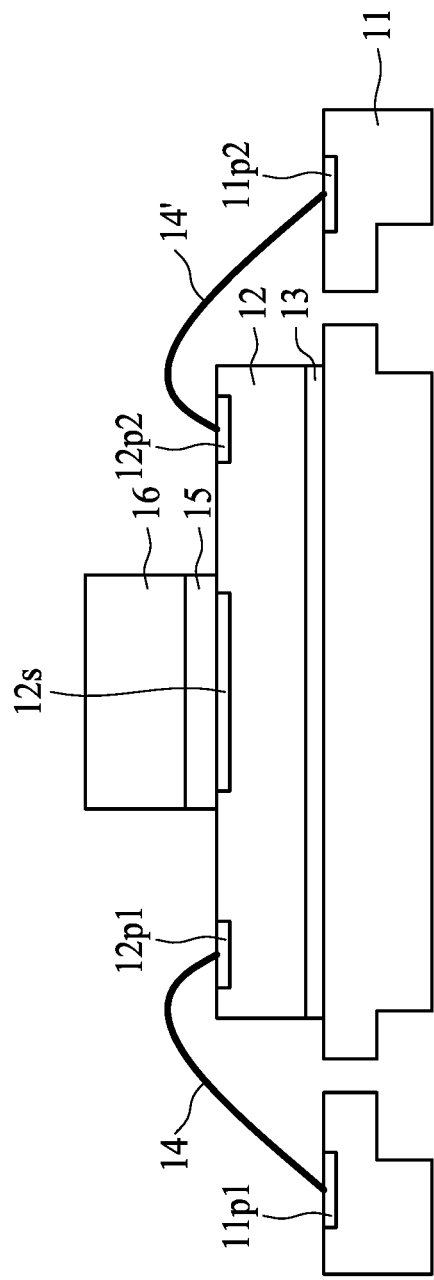
Figure 1F:
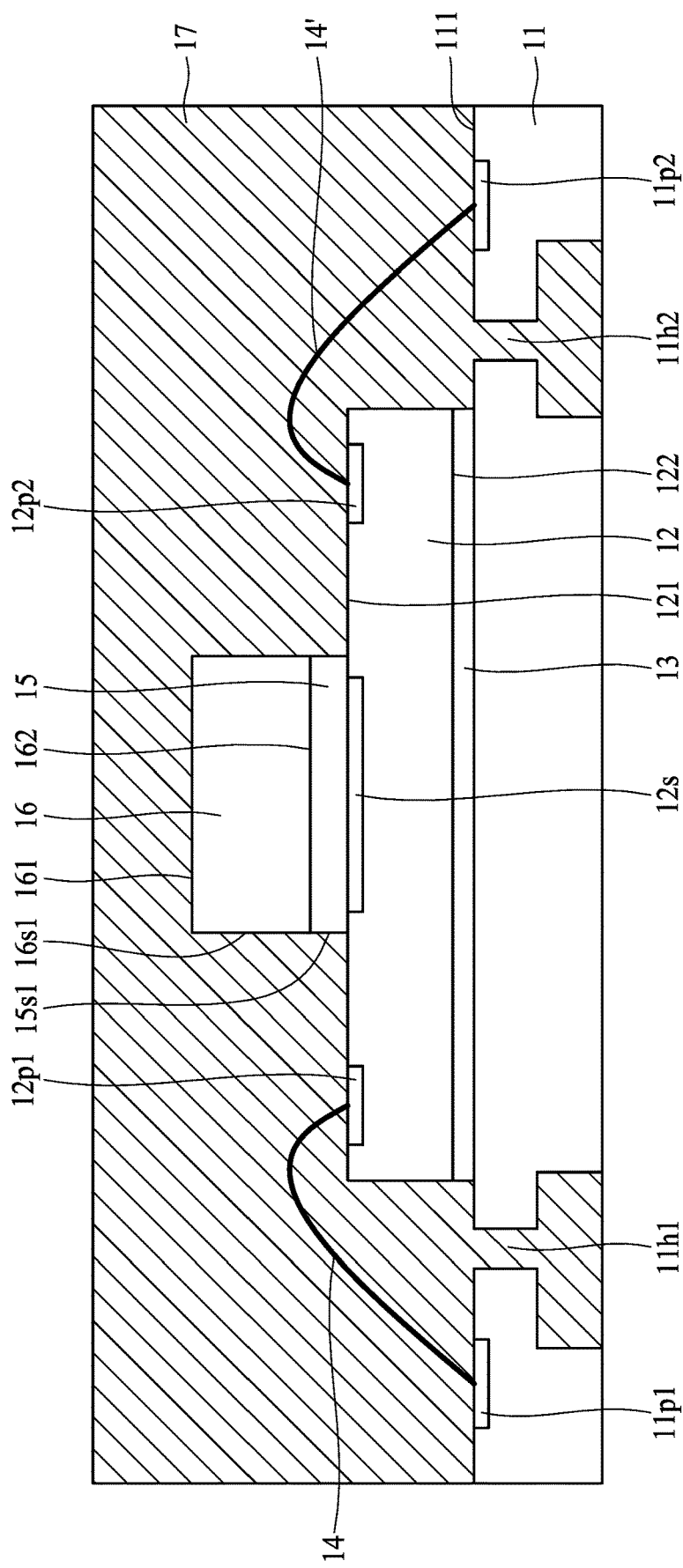

Referring to FIG. 1E, a reinforced structure 16 is disposed on the buffer layer 15. The reinforced structure 16 is directly connected to the buffer layer 15. Referring to FIG. 1F, encapsulating the carrier 11, the electronic component 12, the adhesive layer 13, the conductive wires 14 and 14', the buffer layer 15 and the reinforced structure 16 using the encapsulant 17.

By introducing the buffer layer 15 (e.g., DAF) with low modules and/or the reinforced structure (e.g., a dummy chip or a dummy die), the residual stress resulted from thermal cycle (e.g. coefficient of thermal expansion (CTE) mismatch) during reflow process can be mitigated or alleviated. The design of the semiconductor device package 1 can secure function or performance of the electronic component 12. The design of the semiconductor device package 1 can mitigate or alleviate crack or damage to the encapsulant 17. The design of the semiconductor device package 1 can mitigate or alleviate delamination issue.

Figure 2:
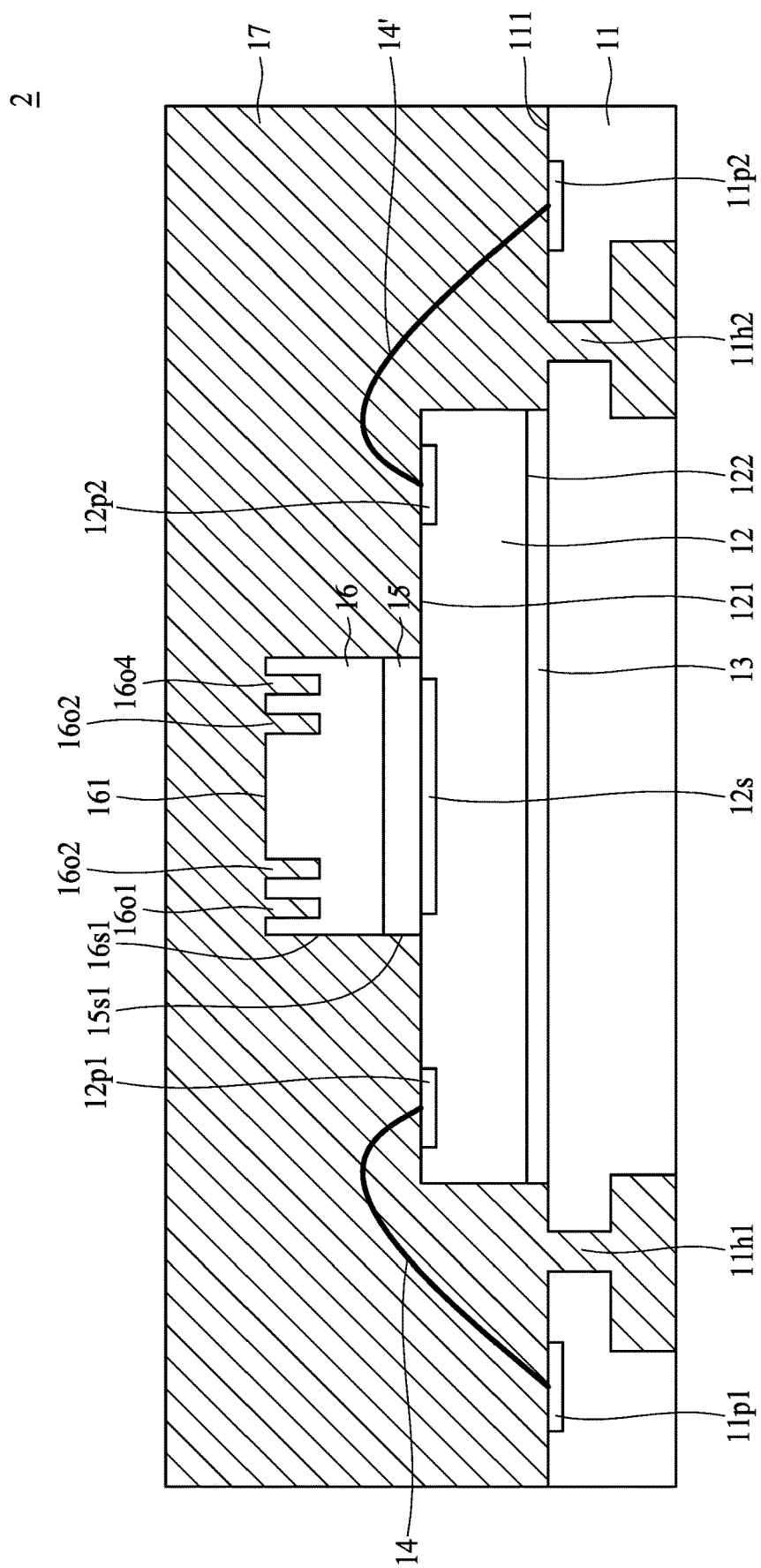
FIG. 2 is a schematic diagram illustrating a cross-sectional view of a semiconductor device package according to some embodiments of the present disclosure.

FIG. 2 is a schematic diagram illustrating a cross-sectional view of a semiconductor device package according to some embodiments of the present disclosure. Referring to FIG. 2, the semiconductor device package 2 includes a carrier 11, an electronic component 12, an adhesive layer 13, conductive wires 14 and 14', a buffer layer 15, a reinforced structure 16 and an encapsulant 17. The semiconductor device package 2 of FIG. 2 is similar to the semiconductor device package 1 of FIG. 1. One difference between the semiconductor device package 2 shown in FIG. 2 and the semiconductor device package 1 shown in FIG. 1 is that the reinforced structure 16 further includes a plurality of openings 16$o$1, 16$o$2, 16$o$3 and 16$o$4.

Referring to FIG. 2, a plurality of openings (also can be referred to as "holes" or "trenches") 16$o$1, 16$o$2, 16$o$3 and 16$o$4 are formed on the surface 161 of the reinforced structure 16 by, for example, lithographic process (e.g., exposure, developing, etching and the like). In some embodiments, the openings 16$o$1, 16$o$2, 16$o$3 and 16$o$4 are formed to expose one or more portions of the reinforced structure 16 such that the exposed portions of the reinforced structure 16 can be filled with the encapsulant 17 (as mold lock structure). The design of the mold lock structure shown in FIG. 2 can enhance adhesion between the reinforced structure 16 and the encapsulant 17.

Figure 3:
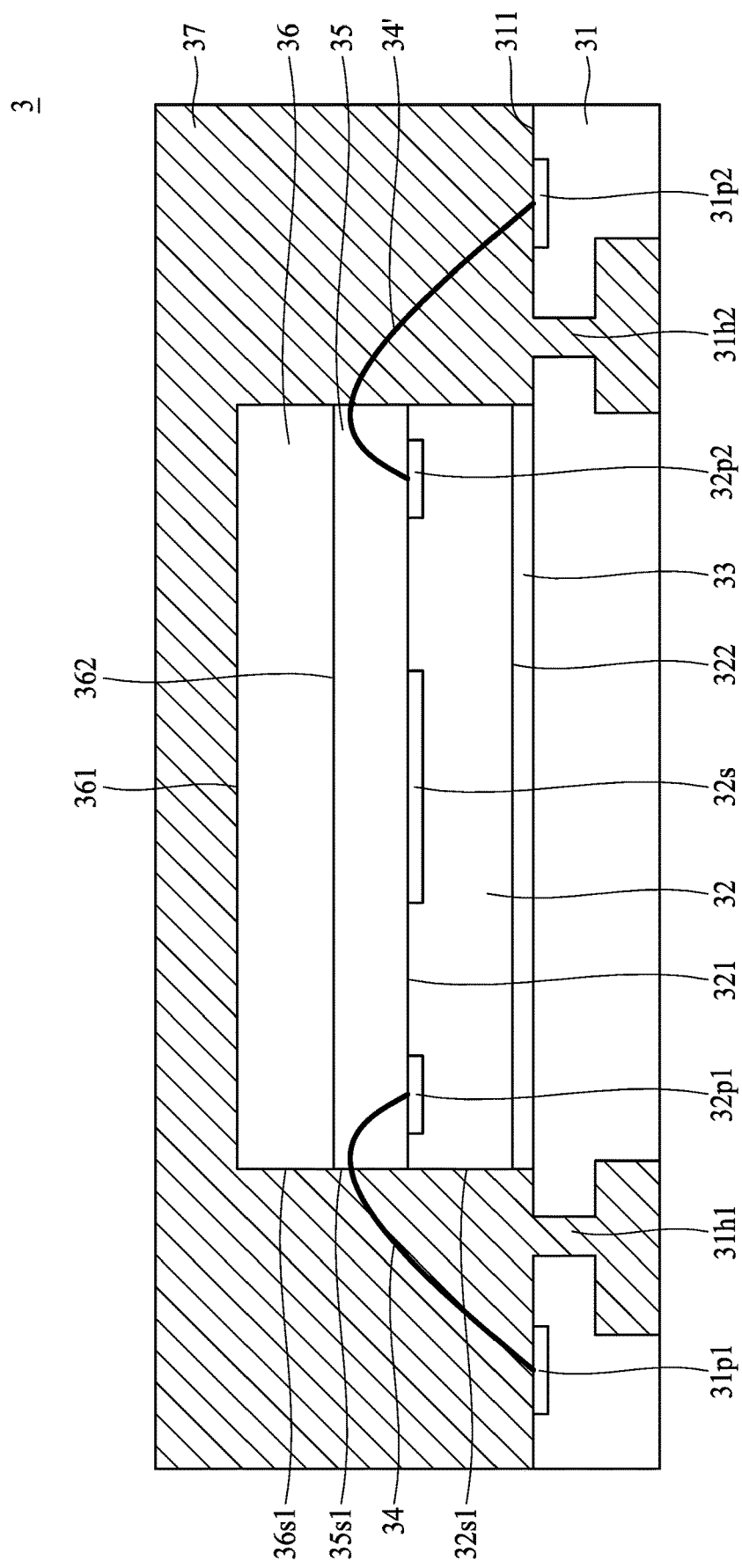
FIG. 3 is a schematic diagram illustrating a cross-sectional view of a semiconductor device package according to some embodiments of the present disclosure.

FIG. 3 is a schematic diagram illustrating a cross-sectional view of a semiconductor device package according to some embodiments of the present disclosure. Referring to FIG. 3, the semiconductor device package 3 includes a carrier 31, an electronic component 32, an adhesive layer 33, conductive wires 34 and 34', a buffer layer 35, a reinforced structure 36 and an encapsulant 37.

The carrier 31 has conductive contacts 31$p$1 and 31$p$2 and openings 31$h$1 and 31$h$2 on the surface 311. In some embodiments, the carrier 31 may be a leadframe or a substrate including one or more traces and/or one or more conductive layers.

The electronic component 32 has a surface 321 and a surface 322 and is disposed over the carrier 31. In some embodiments, the electronic component 32 is attached to the carrier 31 by the adhesive layer 33. The electronic component 32 includes an active area 32$s$ and conductive contacts 32$p$1 and 32$p$2. In some embodiments, the active area 32$s$ is a sensing area used for sensing current or magnetic field/magnetic force. In some embodiments, the electronic component 32 is, for example, a current sensor chip, a Hall current sensor, a magnetic sensor chip or a piezoelectric sensor chip.

The adhesive layer 33 is disposed between the carrier 31 and the electronic component 32. The adhesive layer 33 is directly connected to the surface 322 of the electronic component 32 and the surface 311 of the carrier 31. In some embodiments, the adhesive layer 33 may include glue or a tape. The adhesive layer 33 can include isolation material(s). The adhesive layer 33 can include thermal isolation material(s). Please note that just a small voltage is applied to the electronic component 12 (e.g., sensor chip), the sensor chip itself is not a heat source, and thus the adhesive layer 13 uses thermal isolation material(s) to avoid heat affecting the sensor chip. Please also note that the major factor of heat transfer will be the carrier 11 (e.g., lead frame) as metal material (e.g., the thermal conductivity is around 15~300 W/mK according to some material properties), so the heat transfer of thermal isolation material(s) will not be considered here. The adhesive layer 33 can include electrical isolation material(s). The adhesive layer 33 can include both thermal and electrical isolation material(s). The adhesive layer 13 may include, for example but is not limited to, glass, fused silica, silicon oxide/nitride(silicon chip with oxide/nitride deposition process), ceramics, polymer such as polyimide(PI), porous material such as anodic aluminum oxide (AAO) or other suitable material(s). Although it is not illustrated in FIG. 3, however, it is contemplated that a thermal isolation plate can be disposed between the adhesive layer 33 and the electronic component 32. Although it is not illustrated in FIG. 3, however, it is contemplated that an electrical isolation plate can be disposed between the adhesive layer 33 and the electronic component 32.

The conductive wire 34 connects the electronic component 32 to the carrier 31. One end of the conductive wire 34 is electrically connected to the conductive contact 31$p$1 of the carrier 31. Another end of the conductive wire 34 is electrically connected to the conductive contact 32$p$1 of the electronic component 32. Similarly, one end of the conductive wire 34' is electrically connected to the conductive contact 31$p$2 of the carrier 31. Another end of the conductive wire 34' is electrically connected to the conductive contact 32$p$2 of the electronic component 32.

A buffer layer 35 is disposed on the electronic component 12. The active area 32$s$, the conductive contacts 32$p$1 and 32$p$2 are covered by the buffer layer 35. In some embodiments, the area of the buffer layer 35 is the same as that of the electronic component 32. One end of the conductive wire 34 is covered by the buffer layer 35 and the other end of the conductive wire 34 is exposed from the buffer layer 35. Similarly, one end of the conductive wire 34' is covered by the buffer layer 35 and the other end of the conductive wire 34' is exposed from the buffer layer 35. The lateral surface 35s1 of the buffer layer 35 is substantially coplanar with the lateral surface 32s1 of the electronic component 32.

In some embodiments, the buffer layer 35 is a film over wire (FOW). The buffer layer 35 is a FOW with low Young's modulus. In some embodiments, the Young's modulus of the buffer layer is equal to or less than 10 GPa. In some embodiments, the Young's modulus of the buffer layer is in the range of 5~10 GPa. In some embodiments, the Young's modulus of the buffer layer is in the range of 0~5 GPa. In some embodiments, the Young's modulus of the buffer layer is in the range of 2.5~5.0 GPa. In some embodiments, the CTE of the buffer layer is in the range of 20~100 W/m-K.

The reinforced structure 36 is disposed on the buffer layer 35. The surface 362 of the reinforced structure 36 is directly connected to the buffer layer 35. In some embodiments, the lateral surface 35s1 of the buffer layer 35 is substantially coplanar with the lateral surface 36s1 of the reinforced structure 36. In some embodiments, the lateral surface 32s1 of the electronic component 32, the lateral surface 35s1 of the buffer layer 35 and the lateral surface 36s1 of the reinforced structure 36 are substantially coplanar.

The reinforced structure 36 may include materials that provide stiffness and does not cause phase changes (e.g., the reinforced structure 36 will not be softened) under the reflow temperature (e.g. 260° C.) during the packaging process. In some embodiments, the reinforced structure 36 may include materials with high modules/elastic modulus. The reinforced structure 36 may include materials with high Young's modulus. In some embodiments, the reinforced structure 36 may include materials such as silicon, titanium, glass, metal, alloy, steel etc. In some embodiments, the reinforced structure 16 includes a single crystal material. In some embodiments, the reinforced structure 16 includes a dummy die or a dummy chip. In some embodiments, the Young's modulus of the reinforced structure 36 is in the range of 130~200 GPa. In some embodiments, the CTE of the reinforced structure 36 is in the range of 1.0~5.0 W/m-K. In some embodiments, the CTE of the reinforced structure 36 is in the range of 2.6~3.0 W/m-K.

In some embodiments, the area of the buffer layer 35 is the same as the reinforced structure 36. In some embodiments, the area of the buffer layer 35 is different from the reinforced structure 36. In some embodiments, the area of the buffer layer 35 is smaller than that of the reinforced structure 36. In some embodiments, the area of the buffer layer 35 is greater than that of the reinforced structure 36.

The encapsulant 37 encapsulates the carrier 31, the electronic component 32, the adhesive layer 33, the conductive wires 34 and 34', the buffer layer 35 and the reinforced structure 36. The encapsulant 37 may include an epoxy resin, a molding compound (e.g., an epoxy molding compound (EMC) or other molding compound), or other suitable materials.

FIG. 3A, FIG. 3B, FIG. 3C, FIG. 3D, FIG. 3E and FIG. 3F illustrate a method for packaging a semiconductor device according to some embodiments of the present disclosure.

Figure 3A:
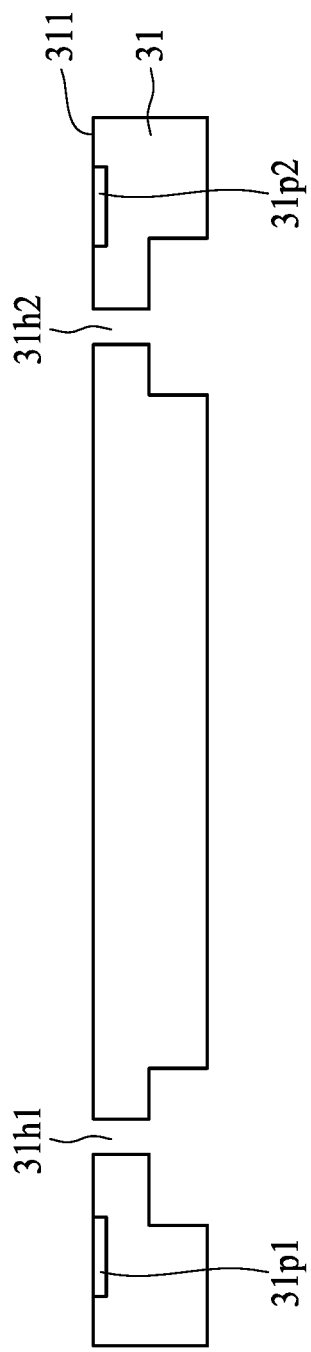
FIG. 3A, FIG. 3B, FIG. 3C, FIG. 3D, FIG. 3E and FIG. 3F illustrate a method for packaging a semiconductor device according to some embodiments of the present disclosure.

Referring to FIG. 3A, a carrier 31 is provided. The carrier 31 includes conductive contacts 31p1 and 31p2 and openings 31h1 and 31h2 on the surface 311. The plurality of openings 31h1 and 31h2 are formed on the carrier 31 by, for example, lithographic process (e.g. exposure, etching and the like).

Figure 3B:
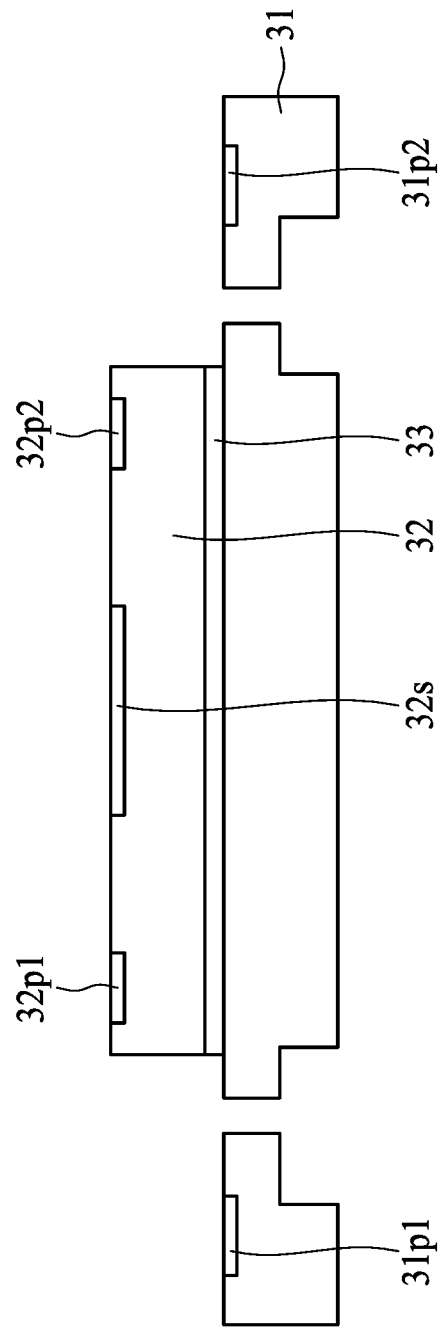

Referring to FIG. 3B, an electronic component 32 with an adhesive layer 33 is disposed on the carrier 31. The electronic component 32 is attached to the carrier 31 by the adhesive layer 33. The electronic component 32 includes an active area 32s and conductive contacts 32p1 and 32p2. In some embodiments, the active area 32s is a sensing area used for sensing current or magnetic field/magnetic force. In some embodiments, the electronic component 32 is, for example, a current sensor chip, a Hall current sensor, a magnetic sensor chip or a piezoelectric sensor chip.

Figure 3C:
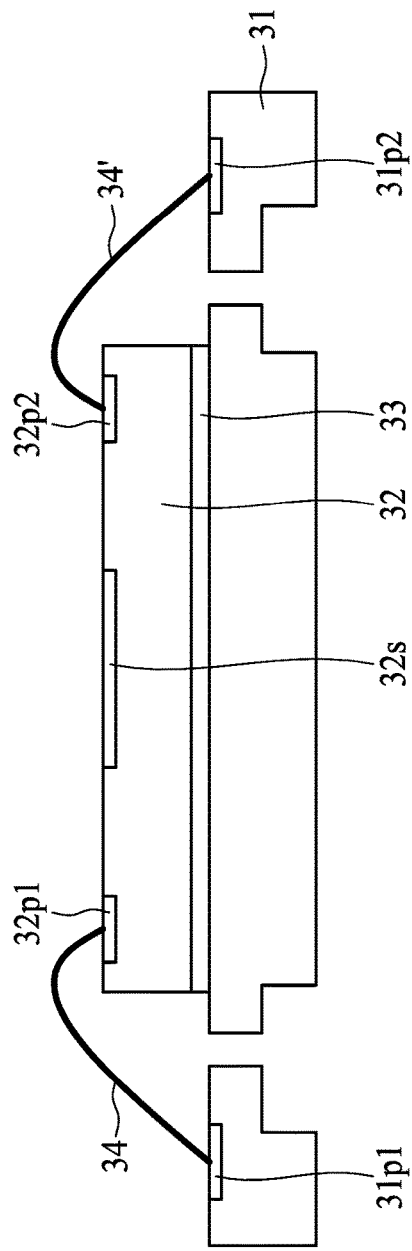

Referring to FIG. 3C, the electronic component 32 is connected to the carrier 31 via wire bonding. One end of the conductive wire 34 is electrically connected to the conductive contact 31p1 of the carrier 31. Another end of the conductive wire 34 is electrically connected to the conductive contact 32p1 of the electronic component 32. Similarly, one end of the conductive wire 34' is electrically connected to the conductive contact 31p2 of the carrier 31. Another end of the conductive wire 34' is electrically connected to the conductive contact 32p2 of the electronic component 32.

Figure 3D:
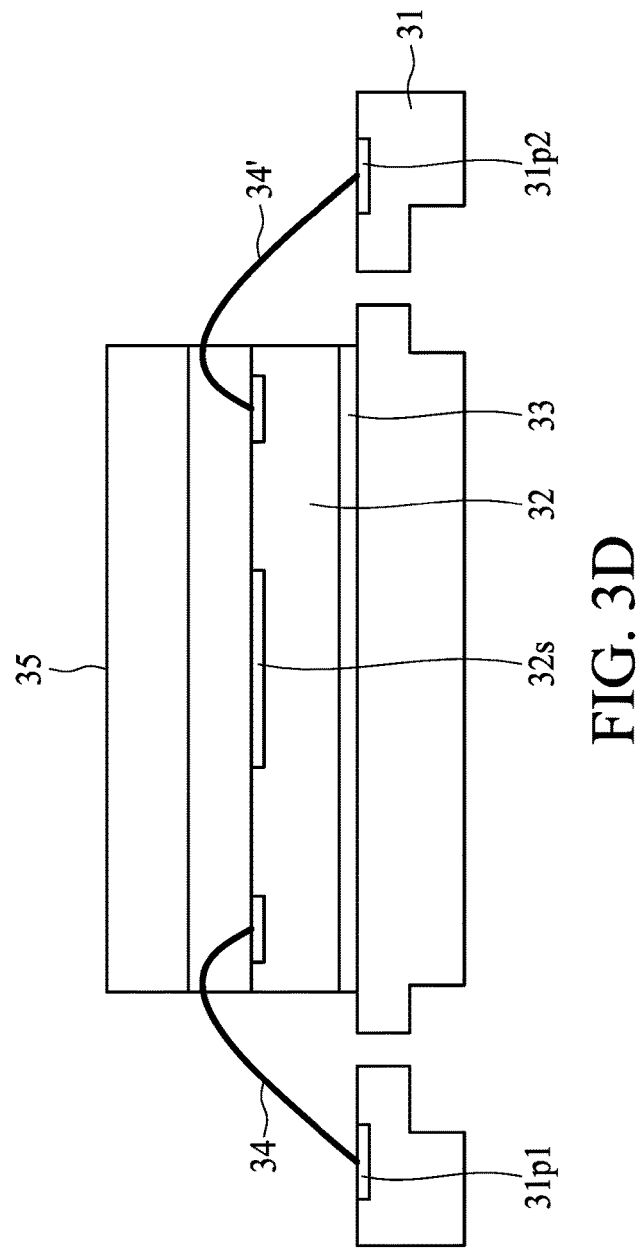

Referring to FIG. 3D, a buffer layer 15 is disposed on the electronic component 12. Before attaching the buffer layer 15 to the electronic component 32, it is specified to raise the temperature to soften the buffer layer 15, and then cover the electronic component 32 and a portion of the conductive wires 34 and 34'. Thereafter, a cooling operation is performed. The buffer layer 15 covers the active area 12s of the electronic component 12.

Figure 3E:
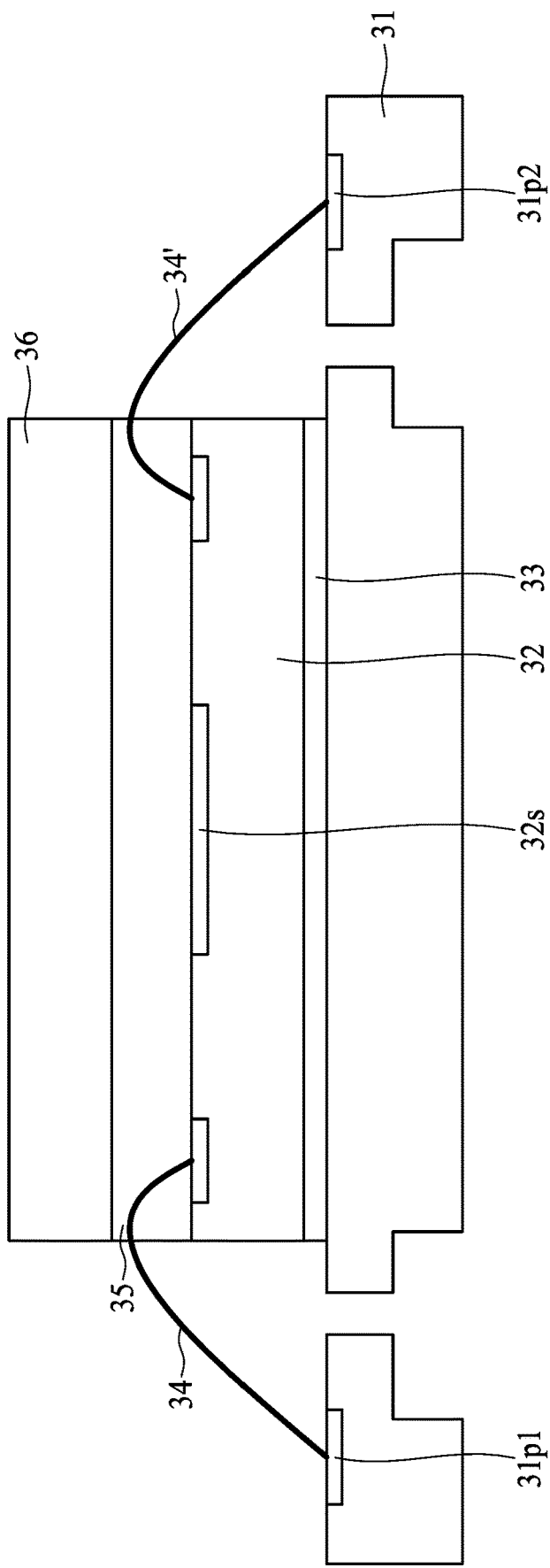
Figure 3F:
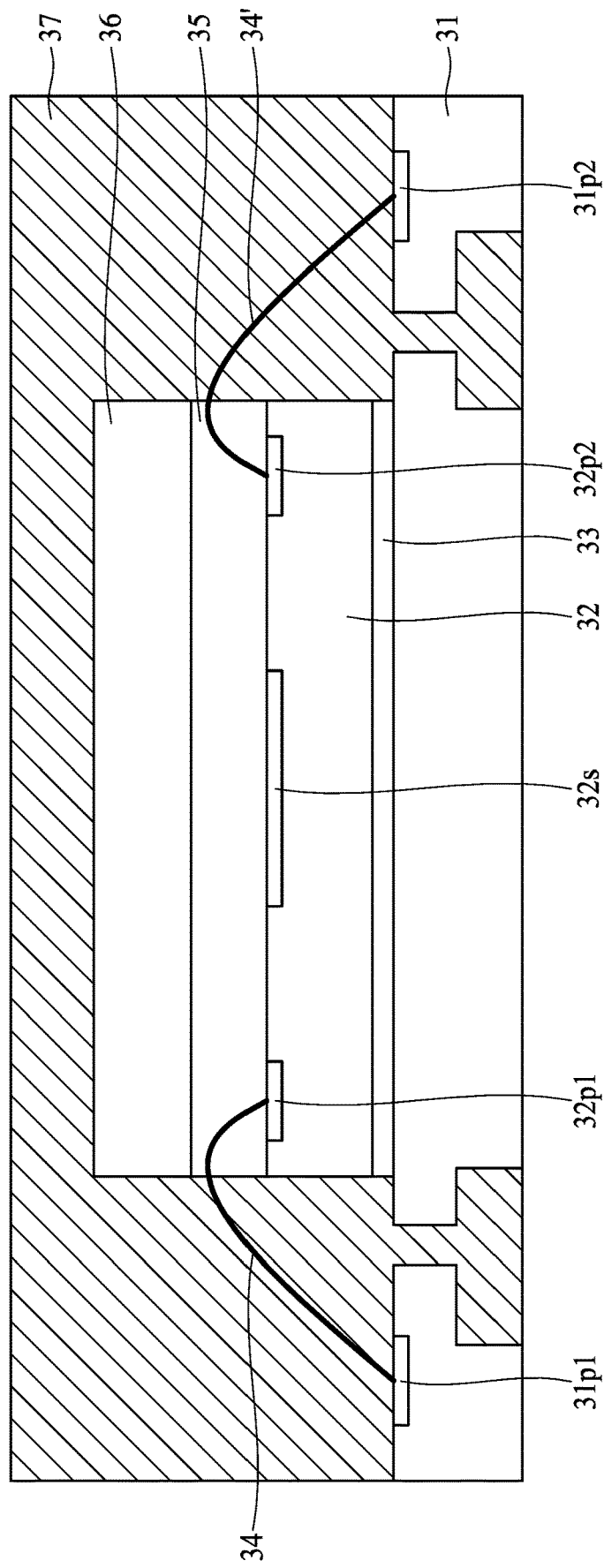

Referring to FIG. 3E, a reinforced structure 36 is disposed on the buffer layer 35. The reinforced structure 36 is directly connected to the buffer layer 35. Referring to FIG. 3F, encapsulating the carrier 31, the electronic component 32, the adhesive layer 33, the conductive wires 34 and 34', the buffer layer 35 and the reinforced structure 36 using the encapsulant 37.

By introducing the buffer layer 35 (e.g., FOW) with low modules and/or the reinforced structure (e.g., a dummy chip or a dummy die), the residual stress resulted from thermal cycle (e.g. coefficient of thermal expansion (CTE) mismatch) during reflow process can be mitigated or alleviated. The design of the semiconductor device package 3 can secure function or performance of the electronic component 32. The design of the semiconductor device package 3 can mitigate or alleviate crack or damage to the encapsulant 37. The design of the semiconductor device package 3 can mitigate or alleviate delamination issue.

Figure 4:
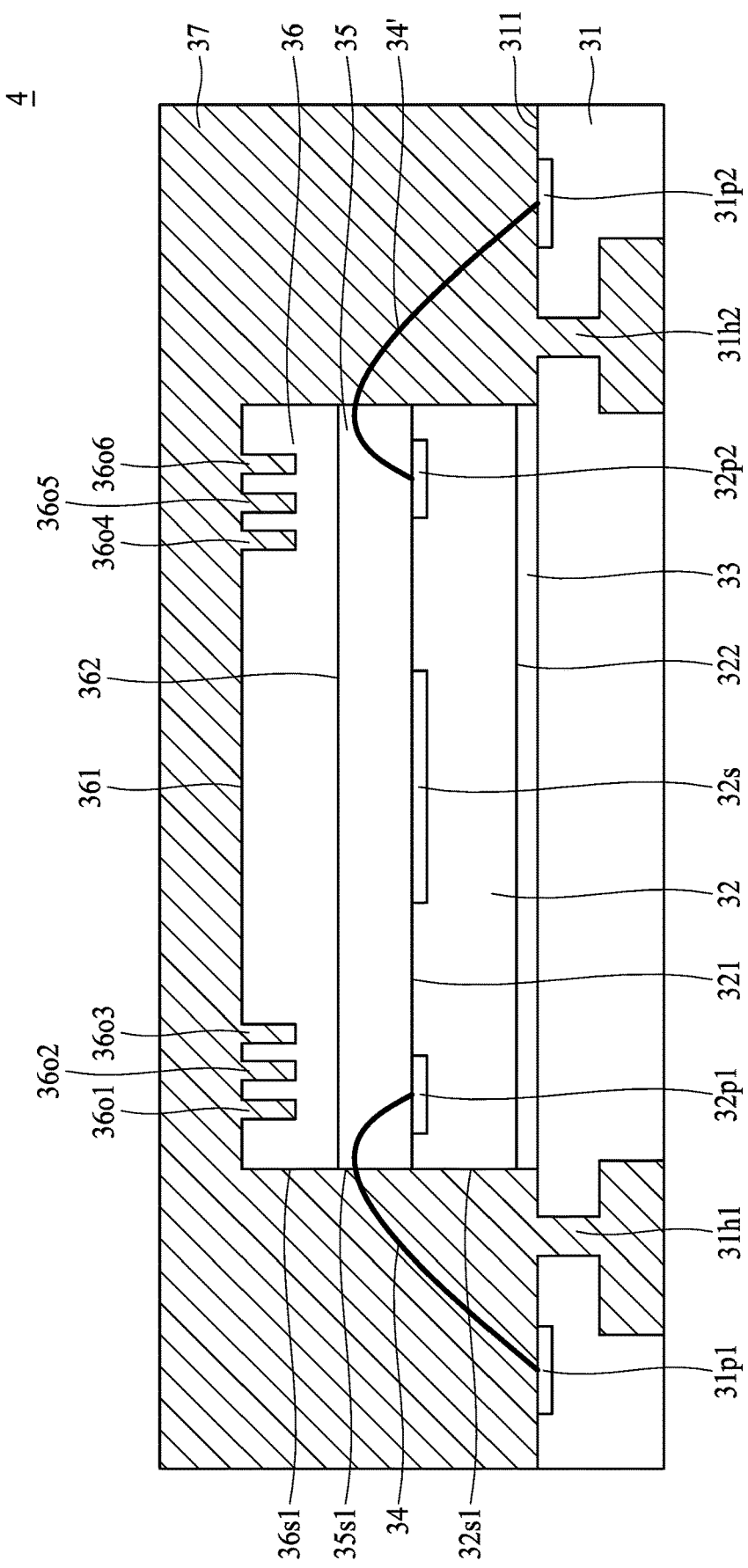
FIG. 4 is a schematic diagram illustrating a cross-sectional view of a semiconductor device package according to some embodiments of the present disclosure.

FIG. 4 is a schematic diagram illustrating a cross-sectional view of a semiconductor device package according to some embodiments of the present disclosure. Referring to FIG. 4, the semiconductor device package 4 includes a carrier 31, an electronic component 32, an adhesive layer 33, conductive wires 34 and 34', a buffer layer 35, a reinforced structure 36 and an encapsulant 37. The semiconductor device package 4 of FIG. 4 is similar to the semiconductor device package 3 of FIG. 3. One difference between the semiconductor device package 4 shown in FIG. 4 and the semiconductor device package 3 shown in FIG. 3 is that the reinforced structure 36 further includes a plurality of openings 36o1, 36o2, 36o3, 36o4, 36o5 and 36o6.

Referring to FIG. 4, a plurality of openings (also can be referred to as "holes" or "trenches") 36o1, 36o2, 36o3, 36o4, 36o5 and 36o6 are formed on the surface 361 of the reinforced structure 36 by, for example, lithographic process (e.g., exposure, developing, etching and the like). In some embodiments, the openings 36o1, 36o2, 36o3, 36o4, 36o5 and 36o6 are formed to expose one or more portions of the reinforced structure 36 such that the exposed portions of the reinforced structure 36 can be filled with the encapsulant 37 (as mold lock structure). The design of the mold lock structure shown in FIG. 4 can enhance adhesion between the reinforced structure 36 and the encapsulant 37.

Figure 5:
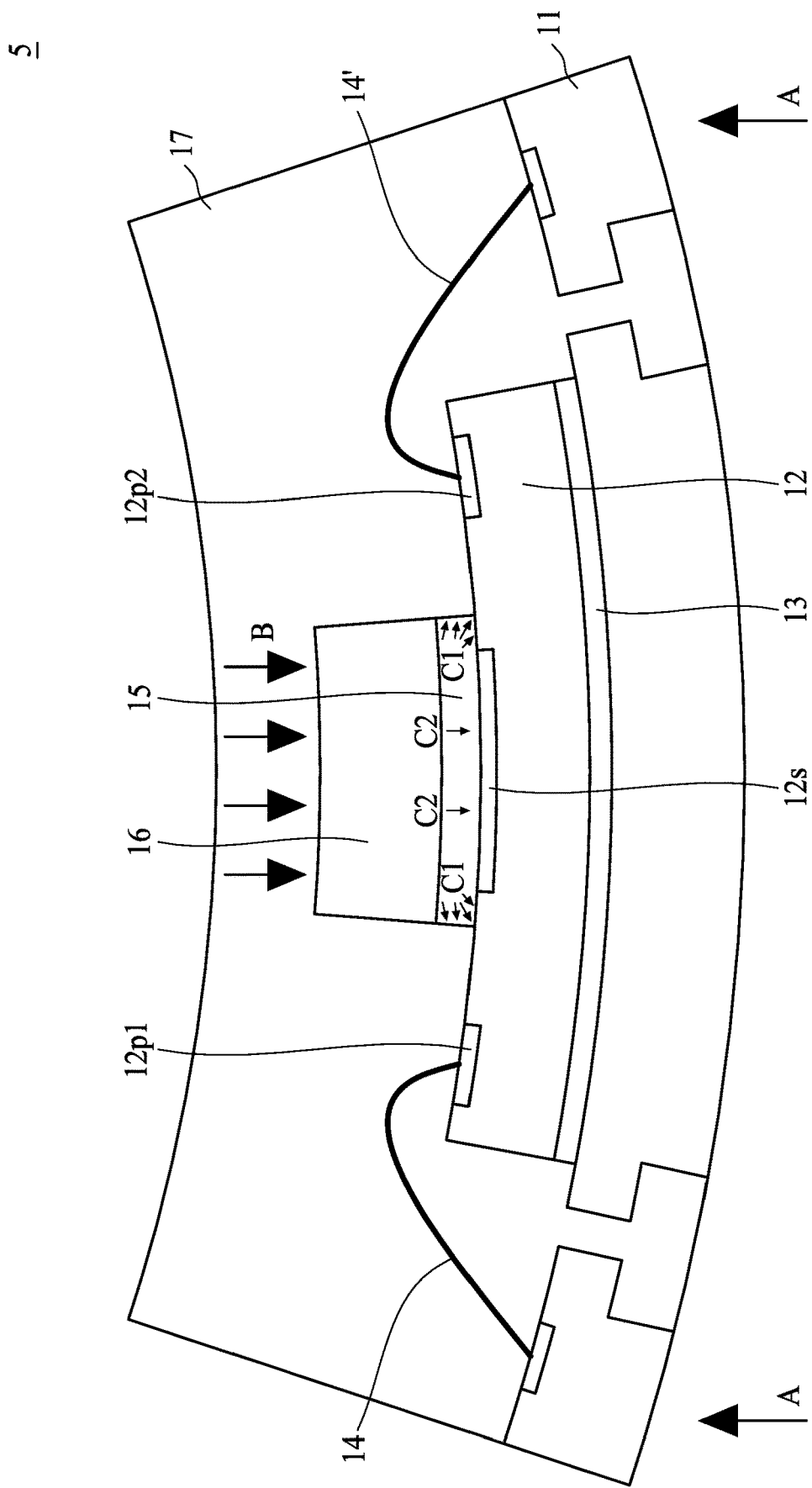
FIG. 5 is a schematic diagram illustrating a cross-sectional view of a semiconductor device package according to some embodiments of the present disclosure.

FIG. 5 is a schematic diagram illustrating a cross-sectional view of a semiconductor device package according to some embodiments of the present disclosure.

Referring to FIG. 5, the semiconductor device package 5 is same or similar to the semiconductor device package 1 as illustrated and described with reference to FIG. 1, except that warpage of the semiconductor device package 5 is illustrated for explanation of stress distribution.

During the manufacturing or packaging of the semiconductor device 12, thermal cycle(s) may cause warpage issue due to CTE mismatch. As shown in FIG. 5, assuming relatively periphery portion or portion around the edge of the semiconductor device package 5 is subjected to stress as denoted by arrows A, the semiconductor device package 5 can warp or bend as illustrated in FIG. 5. The relatively central portion of the semiconductor device package 5, which can include an active area (e.g. sensing area) of the electronic component 12 (e.g., sensor chip) is subjected to stress as denoted by arrows B. The stress B can be redistributed by the buffer layer 15 to the electronic component 12 as denoted by arrows C1 and C2. The stress B can be greater than approximately 2 GPa. For example, the stress B can be approximately 10 GPa, the stress C1 can be equal to or greater than approximately 8 GPa, and the stress C2 can be equal to or less than approximately 2 GPa. Accordingly, after redistribution, the stress C2 applied onto the active area 12s of the electronic component 12 can be equal to or less than approximately 2 GPa, which does not adversely affect performance or function of the electronic component 12. In other words, the electronic component 12 can still function normally even the residual stress B is greater than 2 GPa.

Due to the design of the buffer layer (e.g., DAF or FOW) with low modules, the stress on the active area 12s can be mitigated or relieved, such that the semiconductor device package of the present disclosure can secure function or performance of the sensor chip. Due to the design of the reinforced structure (e.g., dummy chip), the stiffness of the semiconductor device package can be enhanced so as to mitigate or alleviate crack or damage to the encapsulant or to reduce the possibility of delamination.

Figure 6A:
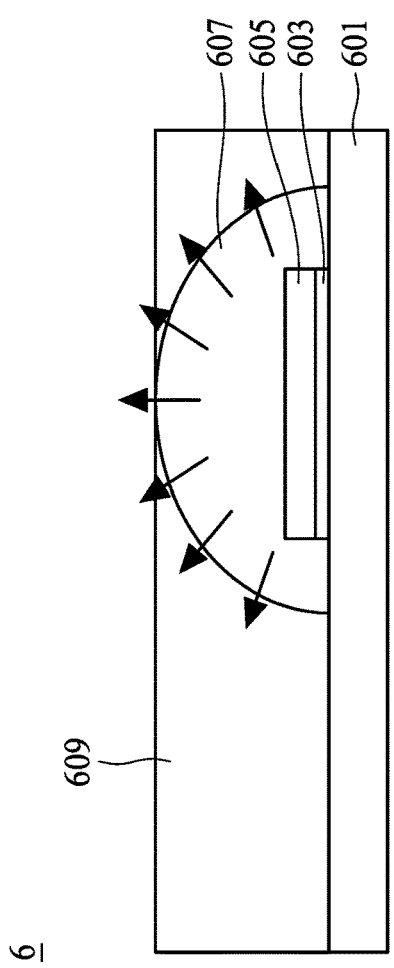
FIG. 6A, FIG. 6B and FIG. 6C are schematic diagrams illustrating semiconductor device packages according to some embodiments of the present disclosure.
Figure 6B:
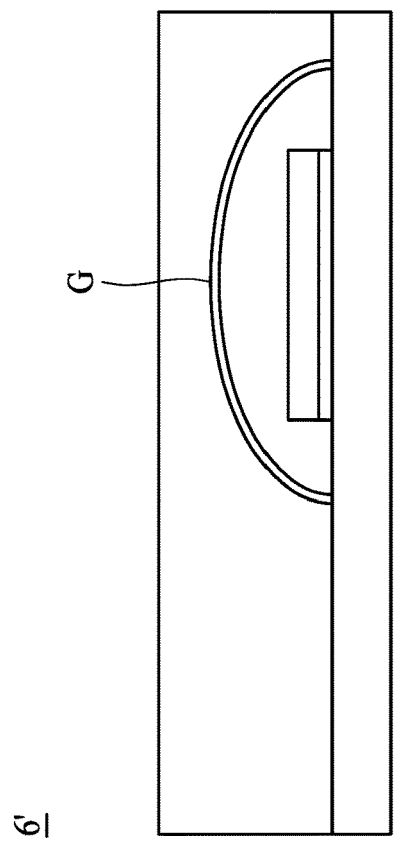
Figure 6C:
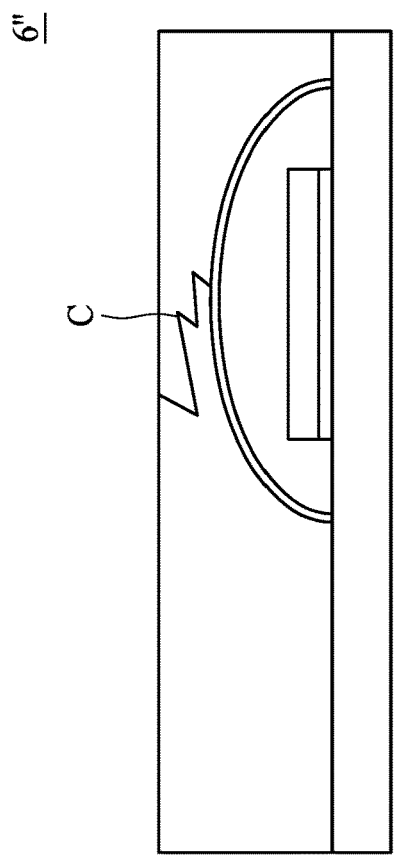

FIGS. 6A, 6B and 6C are schematic diagrams illustrating semiconductor device packages according to some embodiments of the present disclosure.

Referring to FIGS. 6A, 6B and 6C, the semiconductor device package 6 includes a carrier (e.g., a leadframe) 601, an adhesive layer 603, an electronic component (e.g., a chip or a die) 605, a gel coating 607, and an encapsulant (e.g., EMC) 609. During expansion or cure shrinkage of the EMC materials, the gel coating 607 is useful to relieve or mitigate the EMC molding stress. In some embodiments, a gap G may be generated between the gel coating 607 and the EMC 609 under room temperature.

Under the reflow process (at around 260° C.) during the packaging of the semiconductor device 6, the gel coating 607 will expand rapidly (as shown by the arrows in FIG. 6A). After the reflow process, since the difference between the CTE of the gel coating 607 and the CTE of the encapsulant 609 is too large, it will lead to cracks or breakage C in the semiconductor device package 6".

As used herein, the singular terms "a," "an," and "the" may include plural referents unless the context clearly dictates otherwise. In the description of some embodiments, a component provided "on," "above," or "over" another component can encompass cases where the former component is directly on (e.g., in physical contact with) the latter component, as well as cases where one or more intervening components are located between the former component and the latter component.

As used herein, the terms "substantially," "approximately," and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, the term "about" or "substantially" equal in reference to two values can refer to a ratio of the two values being within a range between and inclusive of 0.9 and 1.1

Additionally, amounts, ratios, and other numerical values are sometimes presented herein in a range format. It is to be understood that such a range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure, as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure.

Accordingly, unless specifically indicated herein, the order and grouping of the operations are not limitations of the present disclosure.

What is claimed is:

1. A semiconductor device package, comprising:
a carrier;
an electronic component disposed over the carrier and having an active area;
an interlayer configured protecting the active area of the electronic component;
a reinforced structure disposed on the interlayer; and
a conductive wire electrically connecting the electronic component and the carrier, wherein the conductive wire includes a topmost portion between the reinforced structure and the electronic component in a direction perpendicular to the carrier;

a cap structure disposed on the interlayer and having a recess or trench, wherein a first portion of the recess or the trench of the cap structure is located in an upward projection area of the active area of the electronic component, a bottom surface of the recess or the trench extends from a first inner sidewall of the recess or the trench to a second inner sidewall of the recess or the trench, the carrier comprises a first portion and a second portion separated by an encapsulant, and a lock structure of the encapsulant engages with a lock structure defined by the first portion and the second portion of the carrier.

2. The semiconductor device package of claim 1, wherein the conductive wire is exposed from a lateral surface of the interlayer.

3. The semiconductor device package of claim 2, wherein the lateral surface of the interlayer and a lateral surface of the reinforced structure are substantially coplanar.

4. The semiconductor device package of claim 3, further comprising an adhesive layer between the electronic component and the carrier, wherein the lateral surface of the interlayer and a lateral surface of the adhesive layer are substantially coplanar.

5. The semiconductor device package of claim 1, wherein the electronic component includes a conductive contact located in a downward projection area of the reinforced structure.

6. The semiconductor device package of claim 5, wherein a lateral surface of the electronic component and a lateral surface of the reinforced structure are substantially coplanar.

7. The semiconductor device package of claim 1, wherein an elevation of the topmost portion of the conductive wire is lower than an elevation of a bottom surface of the reinforced structure.

8. The semiconductor device package of claim 7, wherein a vertical distance from the topmost portion of the conductive wire to the bottom surface of the reinforced structure is less than a thickness of the interlayer.

9. The semiconductor device package of claim 1, wherein the interlayer encapsulates the topmost portion of the conductive wire.

10. The semiconductor device package of claim 1, wherein the conductive wire is exposed from a lateral surface of the interlayer, the electronic component includes a conductive contact located in a downward projection area of the reinforced structure, an elevation of the topmost portion of the conductive wire is lower than an elevation of a bottom surface of the reinforced structure, and the interlayer encapsulates the topmost portion of the conductive wire.

11. A semiconductor device package, comprising:
a carrier;
an electronic component disposed over the carrier;
an interlayer disposed on the electronic component;
a cap structure disposed on the interlayer and having a recess or trench;
an encapsulant disposed on the carrier; and
a conductive wire electrically connecting the electronic component and the carrier;
wherein an elevation of a bottom surface of the recess or the trench is higher than an elevation of a topmost portion of the conductive wire, and a first portion of the recess or the trench of the cap structure is located in an upward projection area of an active area of the electronic component, the bottom surface of the recess or the trench extends from a first inner sidewall of the recess or the trench to a second inner sidewall of the recess or the trench, the carrier includes a first portion and a second portion separated by the encapsulant, and a lock structure of the encapsulant engages with a lock structure defined by the first portion and the second portion of the carrier.

12. The semiconductor device package of claim 11, wherein a first portion of the recess or the trench of the cap structure is located in an upward projection area of an active area of the electronic component.

13. The semiconductor device package of claim 12, wherein a second portion of the recess or the trench is located outside the upward projection area of the active area.

14. The semiconductor device package of claim 11, wherein the bottom surface of the recess or the trench extends from a first inner sidewall of the recess or the trench to a second inner sidewall of the recess or the trench.

15. The semiconductor device package of claim 14, wherein the bottom surface of the recess or the trench is spaced apart from an outer sidewall of the cap structure.

16. The semiconductor device package of claim 15, wherein the encapsulant fills the recess or the trench to lock the cap structure.

17. The semiconductor device package of claim 11, wherein the carrier includes a first portion and a second portion separated by the encapsulant, and a lock structure of the encapsulant engages with a lock structure defined by the first portion and the second portion of the carrier.

18. The semiconductor device package of claim 17, wherein the first portion includes a first sidewall, the second portion includes a second sidewall facing the first sidewall of the first portion, and a distance between an upper portion of the first sidewall and an upper portion of the second sidewall is less than a distance between a lower portion of the first sidewall and a lower portion of the second sidewall to constitute the lock structure of the carrier.

19. The semiconductor device package of claim 18, wherein a bottom surface of the encapsulant and a bottom surface of the carrier are substantially coplanar.

* * * * *